(12) United States Patent
Kim

(10) Patent No.: US 7,995,422 B2
(45) Date of Patent: Aug. 9, 2011

(54) BURST ORDER CONTROL CIRCUIT AND METHOD THEREOF

(75) Inventor: Kwang-Hyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 214 days.

(21) Appl. No.: 12/494,717

(22) Filed: Jun. 30, 2009

(65) Prior Publication Data

US 2010/0308883 A1 Dec. 9, 2010

(30) Foreign Application Priority Data

Jun. 5, 2009 (KR) .................. 10-2009-0049971

(51) Int. Cl.
*G11C 8/00* (2006.01)

(52) U.S. Cl. ............... 365/233.18; 365/194; 365/230.06

(58) Field of Classification Search ............ 365/233.18, 365/194, 230.06
See application file for complete search history.

(56) References Cited

U.S. PATENT DOCUMENTS

| 2003/0086515 A1* | 5/2003 | Trans et al. ............ 375/346 |
| 2008/0165594 A1* | 7/2008 | Kim .................... 365/189.11 |

FOREIGN PATENT DOCUMENTS

| KR | 1019970060223 | 8/1997 |
| KR | 1019980066901 | 10/1998 |

OTHER PUBLICATIONS

Notice of Allowance issued from Korean Intellectual Property Office on Nov. 30, 2010.

* cited by examiner

*Primary Examiner* — Son T Dinh
(74) *Attorney, Agent, or Firm* — IP & T Group LLP

(57) ABSTRACT

A burst order control circuit includes a burst signal generating unit configured to receive a seed column address and to generate a first rising burst signal, a second rising burst signal, a first falling burst signal and a second falling burst signal in response to the seed column address, and a repeater unit configured to transfer the first rising burst signal, the second rising burst signal, the first falling burst signal and the second falling burst signal to a pipe latch.

14 Claims, 5 Drawing Sheets

BURST ORDER CONTROL CIRCUIT AND METHOD THEREOF

CROSS-REFERENCE TO RELATED APPLICATIONS

The present application claims priority of Korean patent application number 10-2009-0049971, filed on Jun. 5, 2009, the disclosure of which is incorporated by reference in its entirety.

BACKGROUND OF THE INVENTION

The present invention relates to a burst order control circuit and a method thereof for controlling a burst order in a semiconductor device.

The semiconductor device determines a burst order (data output sequence) based on a seed column address. A circuit for controlling this is referred to as a burst order control circuit.

FIG. 1 is a conventional burst order control circuit.

As shown in FIG. 1, the conventional burst order control circuit includes a burst signal generating unit 110, a repeater unit 120 and a pipe latch 130.

The burst signal generation unit 110 receives a seed column address A<0:2>, a read command signal CASP12RD and latency signals LATENCYSSB and LATENCY2, and generates a burst signal SOSEB<0:2> in response to the read command signal CASP12RD.

A logic level of the burst signal SOSEB<0:2> is identical to a logic level of the seed column address A<0:2>. A first burst signal SOSEB<1> starts the logic value of the seed column address A<1> as an initial value and is toggled at every clock cycle. A second burst signal SOSEB<2> starts the logic value of the seed column address A<2> and is toggled at every other clock cycle.

The latency signals LATENCYSSB and LATENCY2 inputted to the burst signal generating unit 110 have timing information. A first latency signal LATENCYSSB is activated three clock cycles prior to an output clock of data (CL-3). A second latency signal LATENCY2 is activated two clock cycles prior to the output clock of data (CL-2).

The read command signal CASP12RD is activated when a read command CASP12RD is applied.

The burst signal generating unit 110 receives the seed column address A<0:2> in response to the read command signal CASP12RD. The burst signal generating unit 110 adjusts, toggles and transfers a timing of the burst signal SOSEB<0:2> to the repeater unit 120 based on the latency signals LATENCYSSB and LATENCY2.

The repeater unit 120 generates a rising burst signal SOSEBR<1:2> and a falling burst signal SOSEBF<1:2> in response to the burst signal SOSEB<0:2>. The repeater unit 120 shifts the rising burst signal SOSEBR<1:2> and the falling burst signal SOSEBF<1:2> to a data output clock (CL-0), and transfers the rising burst signal SOSEBR<1:2> and the falling burst signal SOSEBF<1:2> to the pipe latch 130.

Logic levels of a second rising burst signal SOSEBR<2> and a second falling burst signal SOSEBF<2> are identical to a logic level of the second burst signal SOSEB<2>. A first rising burst signal SOSEBR<1> has the same logic level as the first burst signal SOSEB<1>. However, a first falling burst signal SOSEBF<1> may have the same logic level as the first burst signal SOSEB<1> or an inverse logic level to the first burst signal SOSEB<1>.

Whether the first falling burst signal SOSEBF<1> has the same logic level as the first burst signal SOSEB<1> or not is determined based on a logic level of a zero burst signal SOSEB<0> and a burst mode setting signal SEQBINT as shown in FIG. 2.

The rising burst signal SOSEBR<1:2> outputted from the repeater unit 120 is transferred to the pipe latch 130, is aligned at a rising clock RCLKDLL and determines a burst order of data to be outputted. The falling burst signal SOSEBF<1:2> outputted from the repeater unit 120 is transferred to the pipe latch 130, is aligned at a falling clock FCLKDLL and determines a burst order of data to be outputted.

For reference, control signals such as the burst signal SOSEB<0:2>, the rising burst signal SOSEBR<1:2> and the falling burst signal SOSEBF<1:2> are toggled at every period and have a different logic value at every clock cycle. Because <1> denotes a toggle at every clock period, <2> denotes a toggle at every other clock period, <1:2> has the same logic value at every four clock cycles.

FIG. 2 is a detailed block diagram illustrating the repeater unit shown in FIG. 1.

As shown in FIG. 2, the repeater unit includes a first shifter unit 210, a second shifter unit 220, a third shifter unit 230, a fourth shifter unit 240, a control signal selection unit 250 and a fifth shifter unit 260.

The first shifter unit 210 receives the second burst signal SOSEB<2> and the falling clock FCLKDLL. The first shifter unit 210 shifts the second burst signal SOSEB<2> for a period of one clock cycle and outputs the second rising burst signal SOSEBR<2> in response to the falling clock FCLKDLL.

The second shifter unit 220 receives the second rising burst signal SOSEBR<2> and the rising clock RCLKDLL. The second shifter unit 220 shifts the second rising burst signal SOSEBR<2> for a period of a half clock cycle and outputs the second falling burst signal SOSEBF<2> in response to the rising clock RCLKDLL. The second rising burst signal SOSEBR<2> determines a burst order of rising data, and the second falling burst signal SOSEBF<2> determines a burst order of falling data. The second rising burst signal SOSEBR<2> has a timing difference of a half clock period from the second falling burst signal SOSEBF<2>.

The third shifter unit 230 receives the first burst signal SOSEB<1> and the falling clock FCLKDLL. The third shifter unit 230 shifts the first burst signal for a period of one clock cycle and outputs the first rising burst signal SOSEBR<1> in response to the falling clock FCLKDLL.

The fourth shifter unit 240 receives the zero burst signal SOSEB<0> and the falling clock FCLKDLL. The fourth shifter unit 240 shifts the zero burst signal SOSEB<0> for a period of one clock cycle and outputs the zero burst signal SOSEB<0> shifted in response to the falling clock FCLKDLL.

The control signal selection unit 250 receives the zero burst signal SOSEB<0> shifted, the first rising burst signal SOSEBR<1> and the burst mode setting signal SEQBINT. The control signal selection unit 250 inverts or does not invert the first rising burst signal SOSEBR<1> in response to the burst mode setting signal SEQBINT and the zero burst signal SOSEB<0>.

The fifth shifter unit 260 receives an output of the control signal selection unit 250 and the rising clock RCLKDLL. The fifth shifter unit 260 shifts the output of the control signal selection unit 250 for a period of a half clock cycle and outputs the first falling burst signal SOSEBF<1> in response to the rising clock RCLKDLL.

FIG. 3 is a timing diagram illustrating a conventional burst order control circuit.

Referring to FIGS. 1 to 3, the burst signal SOSEB<1:2> is outputted from the burst signal generating unit 110 while the burst control signal is activated at one and a half clock prior to the output clock of data (CL-1.5).

The repeater unit 120 shifts the burst signal SOSEB<1:2> for a period of one clock cycle and generates the rising burst signal SOSEBR<1:2>. The repeater unit 120 generates the falling burst signal SOSEBF<1:2> using the rising burst signal SOSEBR<1:2>, and shifts and outputs the falling burst signal SOSEBF<1:2> for a period of a half clock cycle.

A logic value of the first rising burst signal SOSEBR<1> or the first falling burst signal SOSEBF<1> is determined by a logic value of the zero burst signal SOSEB<0> and the burst mode setting signal SEQBINT.

The repeater unit 210 generates the first rising burst signal SOSEBR<1> and the first falling burst signal SOSEBF<1> shifted for a period of a half clock cycle. Because the operation of the repeater unit 210 is to be completed within a half clock cycle, the operation of the repeater may be unstable.

Because the falling burst signal SOSEBF<1:2> is generated from the second and fifth shifter units 220 and 250 which receive the rising burst signal SOSEBR<1:2>, an output node of the rising burst signal SOSEBR<1:2> has a loading difference from an output node of the falling burst signal SOSEBF<1:2>, and a duty characteristic and a skew of the rising burst signal SOSEBR<1:2> and the falling burst signal SOSEBF<1:2> deteriorate. That is, because of the shortage of an operation margin, an operation of the burst order control circuit is unstable.

SUMMARY OF THE INVENTION

Embodiments of the present invention are directed to providing an apparatus and method for evaluating deviation and distribution of a sensing characteristic for a sense amplifier using a test voltage.

Moreover, embodiments of the present invention are directed to providing a burst order control circuit and a method thereof for controlling a burst order in a semiconductor device.

In accordance with an aspect of the present invention, there is provided a burst order control circuit including a burst signal generating unit configured to receive a seed column address and to generate a first rising burst signal, a second rising burst signal, a first falling burst signal and a second falling burst signal in response to the seed column address, and a repeater unit configured to transfer the first rising burst signal, the second rising burst signal, the first falling burst signal and the second falling burst signal to a pipe latch.

The burst signal generating unit may include an address input unit configured to receive the seed column address and to output first to second burst signals, a counter unit configured to generate a first rising burst signal and a second rising burst signal by toggling the first burst signal and the second burst signal, a first falling burst signal generating unit configured to generate a first falling burst signal by inverting or not inverting the first rising burst signal in response to on a zero burst signal and a burst mode setting signal, and a second falling burst signal generating unit configured to generate a second falling burst signal based on the second rising burst signal.

The burst signal generating unit may further include a shifter unit configured to delay the zero burst signal outputted from the address input unit for a period of a delay value of the counter unit and to transfer a delayed zero burst signal to the first falling burst signal generating unit.

The first falling burst signal generating unit may include a selection unit configured to selectively output one of the first rising burst signal and the first burst rising signal inverted in response to the burst mode setting signal and the zero burst signal, and an alignment unit configured to align and output an output signal of the selection unit with a delayed rising clock cycle.

The delayed rising clock may be configured to be obtained by delaying a rising clock outputted from a delayed locked loop to obtain a predetermined margin.

The burst mode setting signal may be configured to be determined by whether the burst mode setting signal is a sequential mode or an interleave mode.

The address input unit may be configured to receive the seed column address in response to a read command signal, and to output the burst signal in response to a first latency signal.

The first latency signal may be configured to be activated three clock cycles prior to an output clock of data.

The counter unit may be configured to toggle the first burst signal at every clock cycle and the second burst signal at every other clock cycle.

The counter unit may receive the first burst signal and the second burst signal in response to a second latency signal having latency information.

The second latency signal may be configured to be activated two clock cycles prior to an output clock of data.

In accordance with another aspect of the present invention, there is provided a burst order control method including receiving a seed column address and outputting zero to second burst signals; outputting a first rising burst signal and a second rising burst signal by toggling the first bust signal and the second bust signal; generating a first falling burst signal by inverting or not inverting the first rising burst signal based on a burst mode setting signal and a delayed zero burst signal, and generating a second falling burst signal by using the second rising burst signal; and transferring the first rising burst signal, the first falling burst signal, the second rising burst signal and the second falling burst signal to a pipe latch.

The outputting the first rising burst signal and the second rising burst signal includes toggling the first burst signal at every clock cycle and the second burst signal at every other clock cycle.

The generating the first falling burst signal includes selecting one of the first rising burst signal or the first rising burst signal inverted in response to the burst mode setting signal and the delayed zero burst signal, and aligning a selected one of the first rising burst signal or the first rising burst signal inverted with a delayed rising clock and generating the first falling burst signal.

DESCRIPTION OF SPECIFIC EMBODIMENTS

Other objects and advantages of the present invention can be understood by the following description, and become apparent with reference to the embodiments of the present invention.

Figure 1:
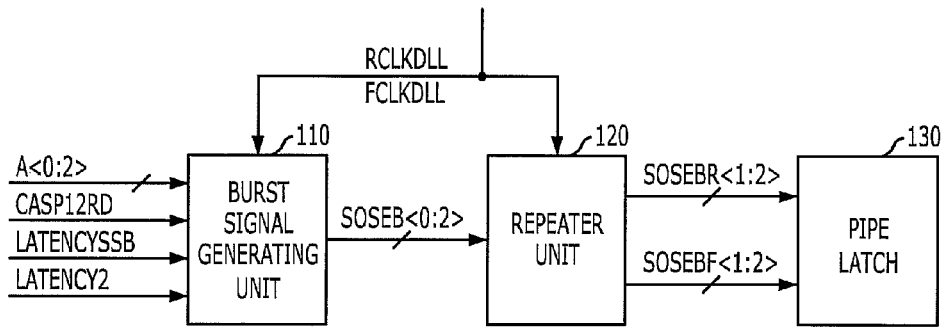
FIG. 1 is a conventional burst order control circuit.
Figure 2:
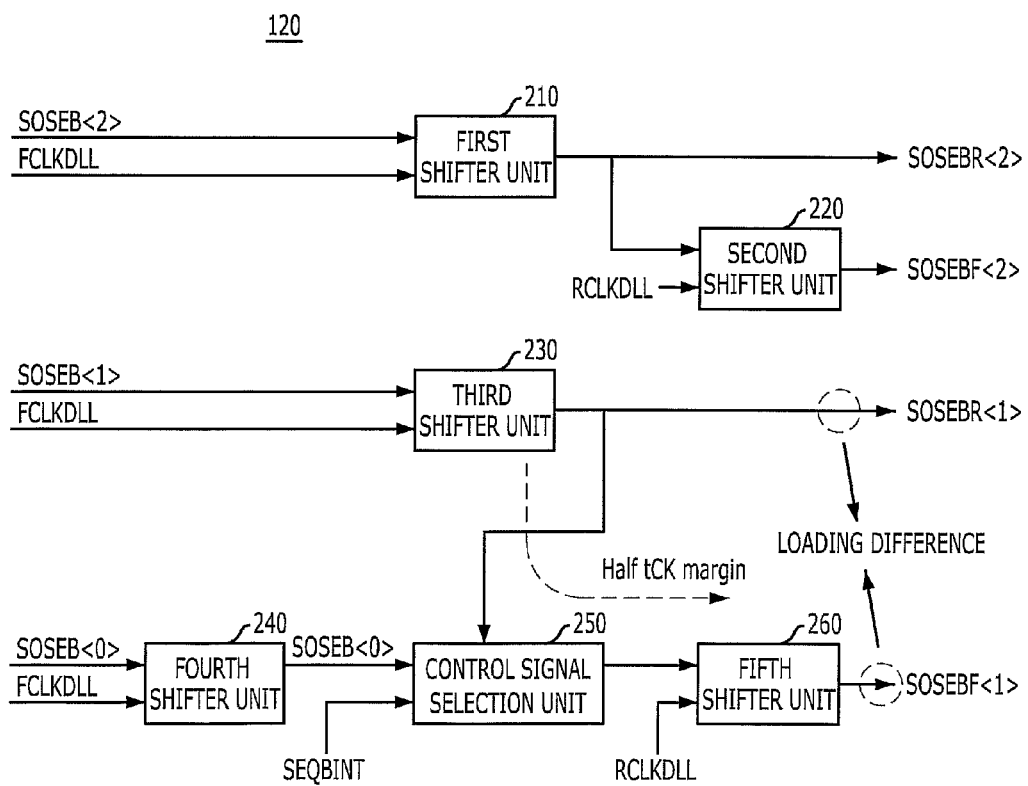
FIG. 2 is a detailed block diagram illustrating the repeater unit shown in FIG. 1.
Figure 3:
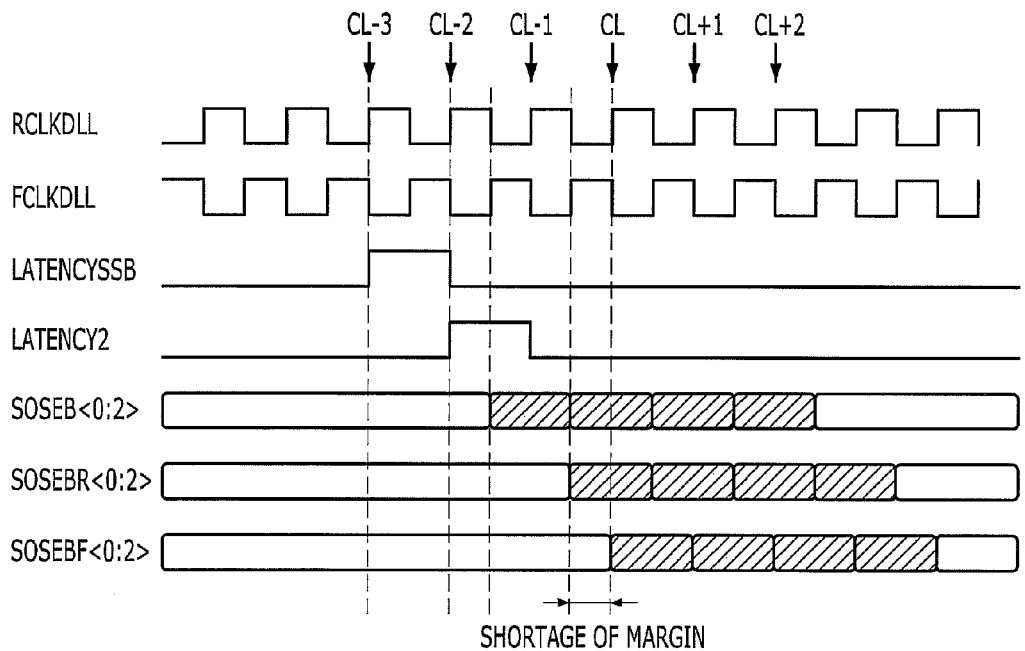
FIG. 3 is a timing diagram illustrating a conventional burst order control circuit.
Figure 4:
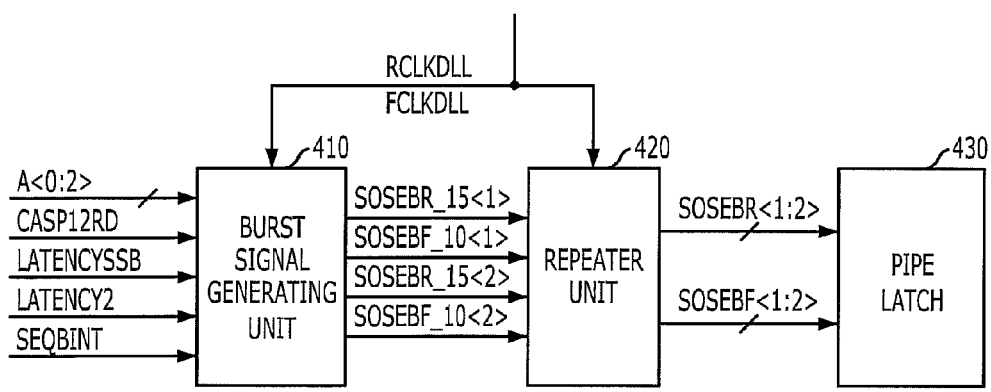
FIG. 4 is a block diagram illustrating a burst order control circuit in accordance with an embodiment of the present invention.

FIG. 4 is a block diagram illustrating a burst order control circuit in accordance with an embodiment of the present invention.

As shown in FIG. 4, a burst order control circuit in accordance with an embodiment of the present invention includes a burst signal generating unit 410, a repeater unit 420 and a pipe latch 430.

The burst signal generating unit 410 receives a seed column address A<0:2>, a read command signal CASP12RD, a burst mode setting signal SEQBINT and latency signals LATENCYSSB and LATENCY2. The burst signal generating unit generates a first rising burst signal SOSEBR_15<1>, a first falling burst signal SOSEBF_10<1>, a second rising burst signal 15<2> and a second falling burst signal SOSEBF_10<2> in response to the read command signal CASP12RD and the burst mode setting signal SEQBINT. A detailed structure of the burst signal generating unit 410 will be described later.

The repeater unit 420 receives and shifts the first rising burst signal SOSEBR_15<1>, the first falling burst signal SOSEBF_10<1>, the second rising burst signal 15<2> and the second falling burst signal SOSEBF_10<2> to a data output clock (CL-0). The repeater unit 420 transfers the rising burst signal SOSEBR<1:2> and the falling burst signal SOSEBF<1:2> to the pipe latch.

Herein, the rising burst signal SOSEBR<1:2> is the first and second rising burst signals SOSEBR_15<1> and SOSEBR_15<2> shifted, and the falling burst signal SOSEBF<1:2> is the first and second falling burst signals SOSEBF_10<1> and SOSEBF_10<2> shifted.

That is, the repeater unit 420 does not generate the first rising burst signal SOSEBR_15<1>, the first falling burst signal SOSEBF_10<1>, the second rising burst signal SOSEBR_15<2> and the second falling burst signal SOSEBF_10<2> and just shifts them.

As shown in FIG. 4, numerals attached to signals denote a timing clock cycle. For example, "15" of the first rising burst signal SOSEBR_15<1> denotes a signal having a timing clock of CL-1.5, and "10" of the first falling burst signal SOSEBF_10<1> denotes a signal having a timing clock CL-1.0.

Figure 5:
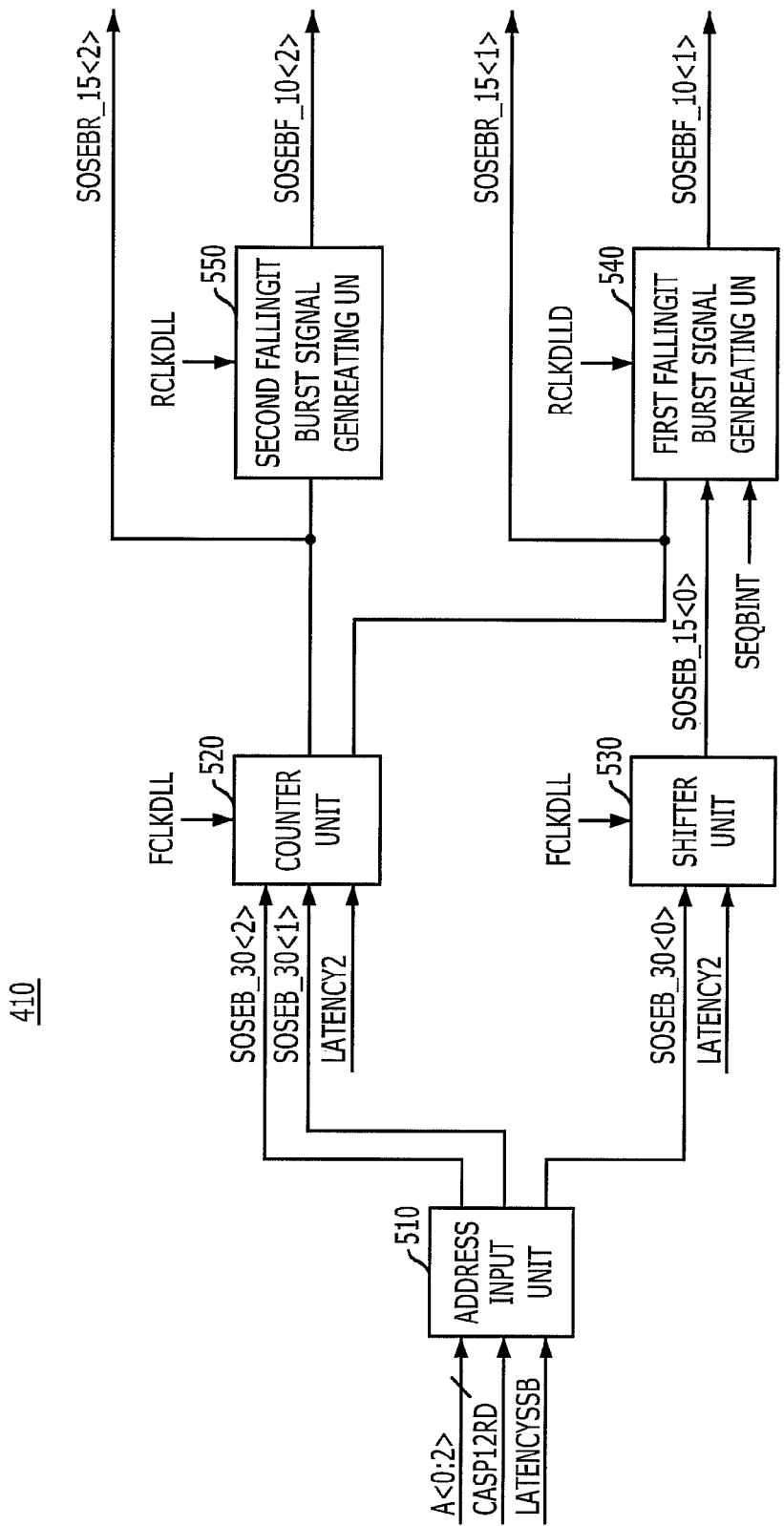
FIG. 5 is a detailed block diagram illustrating a burst signal generating unit shown in FIG. 4.

FIG. 5 is a detailed block diagram illustrating a burst signal generating unit shown in FIG. 4.

As shown in FIG. 5, the burst signal generating unit 410 includes an address input unit 510, a counter unit 520, a shifter unit 530, a first falling burst signal generating unit 540 and a second falling burst signal generating unit 55.

The address input unit 510 receives a seed column address A<0:2>, a read command signal CASP12RD and a first latency signal LATENCYSSB, and outputs a burst signal SOSEB_30<0:2>. That is, the address input unit 510 latches the zero to second seed column address A<0:2> in response to the read command signal CASP12RD, and outputs the burst signal SOSEB_30<0:2> as a latched signal in response to the first latency signal LATENCYSSB. The first latency signal LATENCYSSB has timing clock information where the first latency signal LATENCYSSB is activated three clock cycles prior to an output clock of data (CL-3).

The counter unit 520 receives first and second burst signals SOSEB_30<1> and SOSEB_30<2>, a second latency signal LATENCY2 and a falling clock FCLKDLL. The counter unit 520 toggles the first and second burst signals SOSEB_30<1> and SOSEB_30<2> and generates a first rising burst signal SOSEBR_15<1> and a second rising burst signal SOSEBR_15<2>.

That is, the counter unit 520 outputs the first rising burst signal SOSEBR_15<1> by toggling the first burst signal SOSEB_30<1> at each clock cycle. The counter unit 520 outputs the second rising burst signal SOSEBR_15<2> by toggling the second burst signal SOSEB_30<2> at every other clock cycle.

Herein, the counter unit 520 aligns toggled first and second burst signals to be synchronized with the second latency signal LATENCY2 at CL-2, and then, shifts toggled and aligned first and second burst signals for a period of a half clock cycle based on the falling clock FCLKDLL. *Thus, the first and second rising burst signals SOSEBR_15<1> and SOSEBR_15<2> outputted from the counter unit 520 have timing clock information of CL-1.5.* That is, the counter unit 520 needs 1.5 clock cycle time to output the first and second rising burst signals SOSEBR_15<1> and SOSEBR_15<2> after receiving the first and second burst signals SOSEB_30<1> and SOSEB_30<2>.

The shifter unit 530 receives zero burst signal SOSEB_30<0>, the second latency signal LATENCY2 and a falling clock FCLKDLL. The shifter unit 530 delays the zero burst signal SOSEB_30<0>, which is outputted from the address input unit 510, for a period of a delay value of the counter unit 520, that is, 1.5 clock cycles. The shifter unit 530 transfers a delayed zero burst signal SOSEB_15<0> to the falling burst signal generating unit 540. This is performed to synchronize the timing clock of the zero burst signal SOSEB_30<0> with the timing clock of the first rising burst signal SOSEBR_15<1>.

The first falling burst signal generating unit 540 receives a burst mode setting signal SEQBINT, the delayed zero burst signal SOSEB_15<0> and the first rising burst signal SOSEBR_15<1>, which is outputted from the counter unit 520.

The first falling burst signal generating unit 540 generates a first falling burst signal SOSEBF_10<1> by inverting or not inverting the first rising burst signal SOSEBR_15<1> based on the burst mode setting signal SEQBINT and the delayed zero burst signal SOSEB_15<0>, which is outputted from the shifter unit 530.

If the burst mode setting signal is a logic "low" level (a case of a sequential mode) and the delayed zero burst signal SOSEB_15<0> is a logic "high" level, the first falling burst signal SOSEBF_10<1> is generated by inverting the first rising burst signal SOSEBR_15<1>, but otherwise (in a case of the delayed zero burst signal SOSEB_15<0> is a logic 'low' level or in a case of an interleave mode), the first failing burst signal SOSEBF_10<1> is generated without inverting the first rising burst signal SOSEBR_15<1>.

The first falling burst signal generating unit 540 outputs a first falling burst signal SOSEBF_10<1> by shifting the first falling burst signal SOSEBF_10<1> inverted or non-inverted for a period of a half clock cycle.

That is, the first falling burst signal SOSEBF_10<1> has a timing clock of CL-1. If a burst mode is set to the sequential mode, the burst mode setting signal SEQBINT has a logic 'low' level, and if the burst mode is set to the interleave mode, the burst mode setting signal SEQBINT has a logic 'high' level. The burst mode is determined by a mode register setting (MRS).

The second falling burst signal generating unit 550 receives the second rising burst signal SOSEBR_15<2> and the rising clock RCKDLL, and generates the second falling burst signal SOSEBF_10<2> in response to the rising second burst signal SOSEBR_15<2>.

The second rising burst signal SOEBR_15<2> and the second falling burst signal SOSEBF_10<2> have the same logic value, but the second rising burst signal SOEBR_15<2> and the second falling burst signal SOSEBF_10<2> have a different timing clock cycle.

The second falling burst signal generating unit 550 outputs the second falling burst signal SOSEBF_10<2> by delaying the second burst signal SOSEBR_15<2> for a period of a half clock cycle to be synchronized with the rising clock RCK-DLL.

Figure 6:
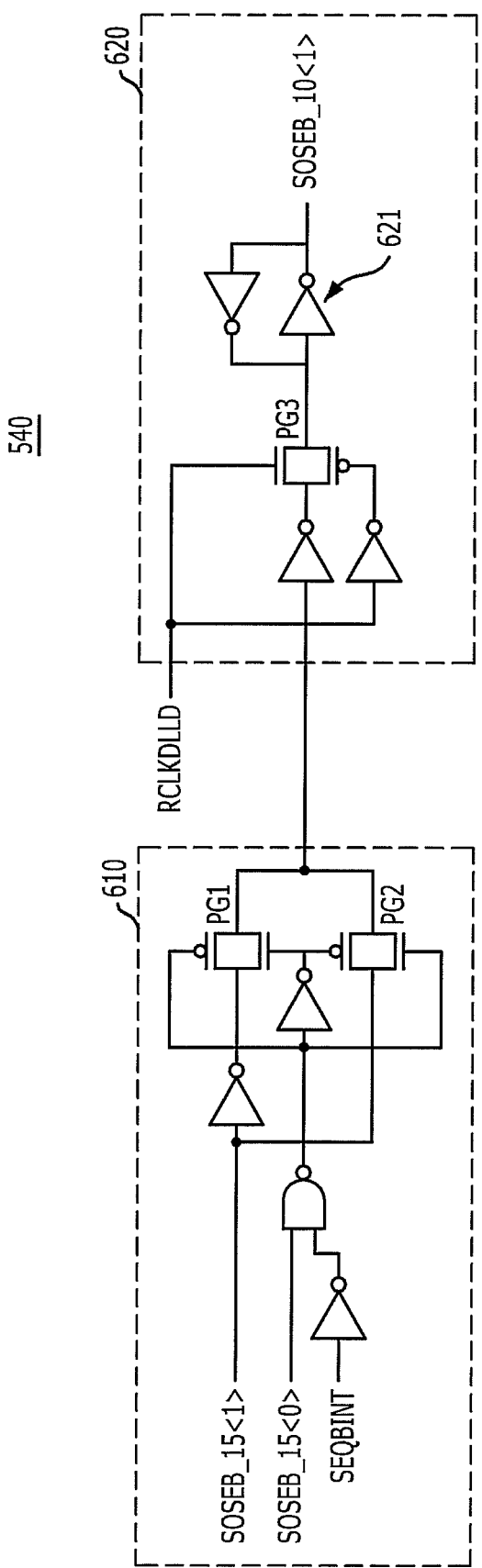
FIG. 6 is a circuit diagram illustrating the first falling burst signal generating unit shown in FIG. 5.

FIG. 6 is a circuit diagram illustrating the first falling burst signal generating unit shown in FIG. 5.

As shown in FIGS. 5 and 6, the first falling burst signal generating unit 540 includes a selection unit 610 and an alignment unit 620. [0078] The selection unit outputs selectively one of the first rising burst signal SOSEB_15<1> inverted and the first rising burst signal SOSEB_15<1> in response to the burst mode setting signal SEQBINT and the delayed zero burst signal SOSEB_15<0>.

If the burst mode setting signal SEQBINT is a logic 'low' level and the delayed zero burst signal SOSEB_15<0> is a logic 'high' level, because a first pass-gate PG1 is turned on and a second pass-gate PG2 is turned off, the first rising burst signal SOSEBR_15<1> is inverted. The first rising signal SOSEBR_15<1> inverted is outputted through the first pass-gate PG1 to the alignment unit 620.

Otherwise, because the first pass gate PG1 is turned off and the second pass-gate PG2 is turned on, the first rising burst signal SOSEBR_15<1> is outputted through the second pass-gate PG2 to the alignment unit 620.

The alignment unit 620 aligns and outputs an output signal of the selection unit 610 with a delayed rising clock RCLKDLLD. The alignment unit 620 includes a third pass-gate PG3 and a latch 620. The third pass-gate PG3 is turned on or off in response to the delayed rising clock RCLKDLLD, which is obtained by delaying the rising clock RCLKDLL outputted from a delayed locked loop (not shown) to obtain a predetermined margin. The latch 621 latches an output signal of the pass gate PG3. That is, a timing loss occurring in the selection unit 610 is compensated by using the delayed rising clock RCLKDLLD instead of the rising clock RCLKDLL.

Figure 7:
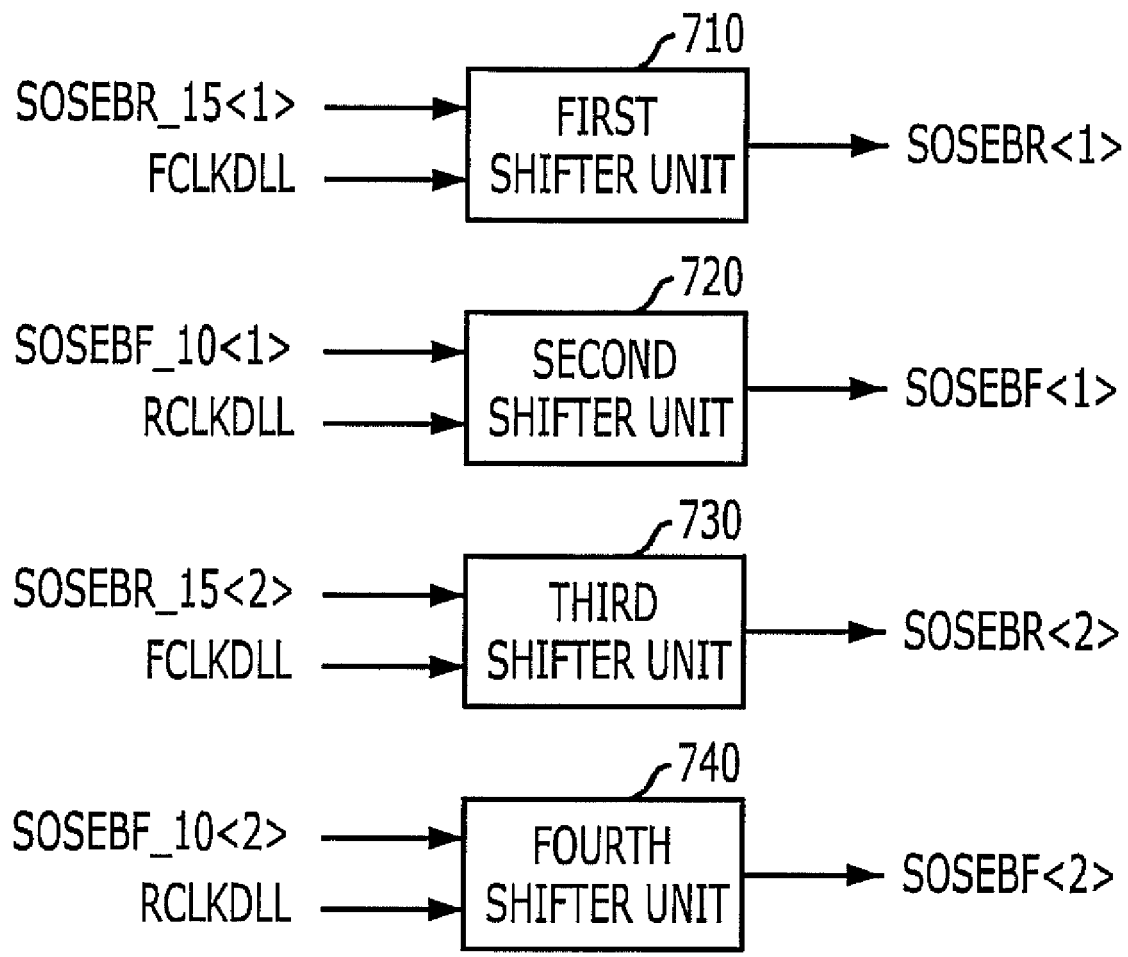
FIG. 7 is a block diagram illustrating the repeater unit shown in FIG. 4.

FIG. 7 is a block diagram illustrating the repeater unit shown in FIG. 4.

As shown in FIGS. 4 and 7, the repeater unit 420 includes first to fourth shifter units 710, 720, 730 and 740 for shifting the rising burst signal SOSEBR_15<1:2> and the falling burst signal SOSEBF_10<1:2> outputted from the burst signal generating unit 410 for a period of one clock cycle.

The rising burst signal SOSEBR_15<1:2> inputted to the repeater unit 420 has a timing clock of CL-1.5. The first and third shifter units 710 and 730 shift the first and second rising burst signals SOSEBR_15<1> and SOSEBR_15<2> for a period of one clock cycle 430 in response to the falling clock FCLKDLL. The first and third shifter units 710 and 730 transfer the first and second rising burst signals SOSEBR<1> and SOSEBR<2> to the pipe latch 430.

The falling burst signal SOSEBF_10<1:2> inputted to the repeater unit 420 has a timing clock of CL-1. The second and fourth shifter units 720 and 740 shift the first and second falling burst signals SOSEBF_10<1> and SOSEBF_10<2> for a period of one clock cycle in response to the rising clock RCLKDLL. The second and fourth shifter units 720 and 740 transfer first and second failing burst signals SOSEBF<1> and SOSEBF<2> to the pipe latch 430.

Because the repeater unit 420 just shifts the rising burst signal SOSEBR_15<1:2> and the falling burst signal SOSEBF_10<1:2> for a period of one clock cycle, the repeater unit 420 has a sufficient margin.

Because the rising burst signal SOSEBR_15<1:2> and the falling burst signal SOSEBF_10<1:2> have the same loading, the burst order control circuit of the present invention prevents the duty and skew characteristics of the output signal from being deteriorated.

Hereinafter, a burst order control method in accordance with another aspect of the present invention will be described referring to FIGS. 4 to 7.

The burst order control method of the present invention includes receiving a seed column address A<0:2> and outputting first and second bust signals SOSEB_30<1> and SOSEB_30<2>; outputting a first rising burst signal SOSEBR_15<1> and a second rising burst signal SOSEBR_15<2> by toggling the first bust signal SOSEB_30<1> and the second bust signal SOSEB_30<2>; generating a first falling burst signal SOSEBF_10<1> by inverting or not inverting the first rising burst signal SOSEBR_15<1> based on a burst mode setting signal SEQBINT and a delayed zero burst signal SOSEB_15<0>, and generating a second falling burst signal SOEBF_10<2> by using the second rising burst signal SOSEBR_15<2>; and shifting the first rising burst signal SOSEBR_15<1>, the first falling burst signal SOSEBF_10<1>, the second rising burst signal SOSEBR_15<2> and the second falling burst signal SOSEBF_10<2> to be matched with an output clock of data, and transferring the rising burst signal SOSEBR<1:2> and the falling burst signal SOSEBF<1:2> to a pipe latch 430.

Herein, the rising burst signal SOSEBR<1:2> is the first and second rising burst signals SOSEBR_15<1> and SOSEBR_15<2> shifted, and the falling burst signal SOSEBF<1:2> is the first and second falling burst signals SOSEBF_10<1> and SOSEBF_10<2> shifted.

The outputting of the first rising burst signal SOSEBR_15<1> and a second rising burst signal SOSEBR_15<2> includes toggling the first bust signal SOSEB_30<1> at every clock cycle and the second bust signal SOSEB_30<2> at every other clock cycle.

The generating the first falling burst signal SOSEBF_10<1> and the second falling burst signal SOEBF_10<2> includes selecting one of the first burst signal SOSEBR_15<1> and the first burst signal SOSEBR_15<1> inverted in response to the burst mode setting signal SEQBINT and the zero burst signal SOSEB_15<0>; and aligning a selected signal with a delayed rising clock RCLKDLLD and generating the first falling burst signal SOSEBF_10<1>.

While the present invention has been described with respect to the specific embodiments, it will be apparent to those skilled in the art that various changes and modifications may be made without departing from the spirit and scope of the invention as defined in the following claims.

What is claimed is:
1. A burst order control circuit, comprising:
  a burst signal generating unit configured to receive a seed column address and to generate a first rising burst signal, a second rising burst signal, a first falling burst signal and a second falling burst signal in response to the seed column address; and
  a repeater unit configured to transfer the first rising burst signal, the second rising burst signal, the first falling burst signal and the second falling burst signal to a pipe latch.

2. The burst order control circuit of claim 1, wherein the burst signal generating unit comprises
   an address input unit configured to receive the seed column address and to output first to second burst signals;
   a counter unit configured to generate a first rising burst signal and a second rising burst signal by toggling the first burst signal and the second burst signal;
   a first falling burst signal generating unit configured to generate a first falling burst signal by inverting or not inverting the first rising burst signal in response to on a zero burst signal and a burst mode setting signal; and
   a second falling burst signal generating unit configured to generate a second falling burst signal based on the second rising burst signal.

3. The burst order control circuit of claim 2, wherein the burst signal generating unit further comprises a shifter unit configured to delay the zero burst signal outputted from the address input unit for a period of a delay value of the counter unit and to transfer a delayed zero burst signal to the first falling burst signal generating unit.

4. The burst order control circuit of claim 2, wherein the first falling burst signal generating unit includes a selection unit configured to selectively output one of the first rising burst signal and the first burst rising signal inverted in response to the burst mode setting signal and the zero burst signal, and an alignment unit configured to align and output an output signal of the selection unit with a delayed rising clock cycle.

5. The burst order control circuit of claim 4, wherein the delayed rising clock is configured to be obtained by delaying a rising clock outputted from a delayed locked loop to obtain a predetermined margin.

6. The burst order control circuit of claim 4, wherein the burst mode setting signal is configured to be determined by whether the burst mode setting signal is a sequential mode or an interleave mode.

7. The burst order control circuit of claim 3, wherein the address input unit is configured to receive the seed column address in response to a read command signal, and to output the burst signal in response to a first latency signal.

8. The burst order control circuit of claim 7, wherein the first latency signal is configured to be activated three clock cycles prior to an output clock of data.

9. The burst order control circuit of claim 3, wherein the counter unit is configured to toggle the first burst signal at every clock cycle and the second burst signal at every other clock cycle.

10. The burst order control circuit of claim 9, wherein the counter unit is configured to receive the first burst signal and the second burst signal in response to a second latency signal having latency information.

11. The burst order control circuit of claim 10, wherein the second latency signal is configured to be activated two clock cycles prior to an output clock of data.

12. A burst order control method, comprising:
   receiving a seed column address and outputting zero to second burst signals;
   outputting a first rising burst signal and a second rising burst signal by toggling the first bust signal and the second bust signal;
   generating a first falling burst signal by inverting or not inverting the first rising burst signal based on a burst mode setting signal and a delayed zero burst signal, and generating a second falling burst signal by using the second rising burst signal; and
   transferring the first rising burst signal, the first falling burst signal, the second rising burst signal and the second falling burst signal to a pipe latch.

13. The burst order control method of claim 12, wherein the outputting the first rising burst signal and the second rising burst signal includes toggling the first burst signal at every clock cycle and the second burst signal at every other clock cycle.

14. The burst order control method of claim 12, wherein the generating the first falling burst signal includes
   selecting one of the first rising burst signal or the first rising burst signal inverted in response to the burst mode setting signal and the delayed zero burst signal; and
   aligning a selected one of the first rising burst signal or the first rising burst signal inverted with a delayed rising clock and generating the first falling burst signal.

* * * * *